US006044533A

United States Patent [19]

Bureau et al.

[11] Patent Number: 6,044,533

[45] Date of Patent: Apr. 4, 2000

[54] METHOD OF MAKING AN ACOUSTIC PROBE

[75] Inventors: Jean-Marc Bureau, Bures Sur Yvette; François Bernard, Les Ulis; Serge Calisti, Marseille, all of France

[73] Assignee: Thomson-CSF, Paris, France

[21] Appl. No.: 08/849,734

[22] PCT Filed: Oct. 22, 1996

[86] PCT No.: PCT/FR96/01650

§ 371 Date: Jul. 2, 1997

§ 102(e) Date: Jul. 2, 1997

[87] PCT Pub. No.: WO97/17145

PCT Pub. Date: May 15, 1997

[30] Foreign Application Priority Data

Nov. 3, 1995 [FR] France .................................. 95 12999

[51] Int. Cl.[7] ..................................................... H01L 41/22

[52] U.S. Cl. ........................... 29/25.35; 29/848; 310/334; 310/365

[58] Field of Search .................................... 29/25.35, 846, 29/848; 310/334, 365

[56] References Cited

FOREIGN PATENT DOCUMENTS

0694338A2 1/1996 European Pat. Off. .

*Primary Examiner*—Carl E. Hall

*Attorney, Agent, or Firm*—Oblon, Spivak, McClelland, Maier & Neustadt, P.C.

[57] ABSTRACT

An acoustic probe and a method for making the same. The probe includes a novel interconnection network consisting of two portions, i.e., a first portion in which M×N conductive paths have a section contacting M×N piezoelectric transducers and are arranged at a pitch ($P_N$) in a direction ($D_x$) and at a pitch ($P_M$) in direction ($D_y$) within the acoustic absorption material; and a second portion in which the M×N conductive paths are arranged on M dielectric substrates spaced apart at a pitch ($P'_M$) and each provided with N paths are arranged at a pitch ($P'_N$). A method for making the acoustic probe is also disclosed. The dielectric substrates may advantageously be flexible printed circuits optionally including chips.

3 Claims, 6 Drawing Sheets

METHOD OF MAKING AN ACOUSTIC PROBE

BACKGROUND OF THE INVENTION

The field of the invention is that of acoustic transducers which can be used in particular in medical or underwater imaging.

DISCUSSION OF THE BACKGROUND

In general, an acoustic probe comprises a set of piezoelectric transducers connected to an electronic control device via an interconnection system. These piezoelectric transducers emit acoustic waves which, after reflection off a given medium, deliver information relating to the said medium. Acoustic waves emitted not towards the external medium to be analysed, but in the opposite direction, disturb the response of the medium and make it essential to interpose, between the piezoelectric transducers and the electronic device, a medium which absorbs the acoustic waves. The presence of this intermediate element makes the interconnection of all the transducers even more complicated.

This interconnection problem is one of the main problems currently encountered in the manufacture of acoustic imaging probes. This is because the miniaturization and the number of piezoelectric elements, combined with the space limitation constraints encountered in echograph probes designed to be used in intracavity mode, require increasingly integrated technologies.

However, when a two-dimensional matrix of transducers is envisaged, it is necessary to produce a surface-type system for connecting the elements, this being complicated by the presence of the acoustically absorbent layer.

Currently, several solutions have been envisaged.

Thus, the Applicant Company in its patent application published under U.S. Pat. No. 2,702,309 describes a process for producing a surface-type connection system which uses an intermediate polymer film sufficiently thin not to disturb the acoustic operation of the transducers, through which film conducting tracks brought into contact with the acoustic transducers are produced. Nevertheless, the interconnection of a two-dimensional matrix having a large number of elements may require the production of a multilayer structure, which means limitations in terms of manufacturing cost and of acoustic "transparency".

Another problem, related to the problem of multiplicity of the connections, is that of the electronics for the transducers. This is because electronic circuits are necessary to manage both the emission and reception of the elements of the transducer. In the case of medical imaging where ergonomics of the probe are essential, these circuits are presently transferred to the echograph, which constitutes the unit for controlling and processing the signal. This configuration requires the use of coaxial cables (one per transducer element) between the probe and the echograph, causing problems in the case of a large number of elements. There is therefore a strong motivation to integrate as close as possible to the transducer some of this electronic circuitry, such as, for example, preamplification integrated circuits.

SUMMARY OF THE INVENTION

In order to respond to these various problems, the subject of the invention is an acoustic probe comprising a matrix of M piezoelectric transducers in a direction $D_y$ and of N piezoelectric transducers in a direction $D_x$ orthogonal to $D_y$, these being distributed on the surface of an acoustically absorbent material, and an interconnection system connecting the acoustic transducers to an electronic device, characterized in that the interconnection system comprises:

- a first part 1 in which M×N conducting tracks have a section in contact with the M×N piezoelectric transducers and are distributed with a spacing $P_N$ in the direction $D_x$ and with a spacing $P_M$ in the direction $D_y$, within the acoustically absorbent material;
- a second part 2 in which the M×N conducting tracks are distributed over M dielectric substrates separated by a spacing $P'_M$ each comprising N tracks distributed with a spacing $P'_N$.

According to one variant of the invention, the dielectric substrates are flexible printed circuits. Advantageously, they may comprise components connected as input to the N conducting rows and as output to $N_S$ conducting rows, $N_S$ being less than N.

In one variant of the invention, the spacing $P'_N$ may advantageously increase along an axis $D_z$ perpendicular to the plane defined by the directions $D_x$ and $D_y$.

The spacing $P'_M$ may also advantageously increase along the said direction $D_z$.

Non-limitingly, the spacings $P_N$ and $P_M$ may be equal.

The acoustically absorbent material may typically be an epoxy resin filled with particles whose function is to absorb or scatter the acoustic waves, such as tungsten, silica or polymer particles or air bubbles.

The dielectric substrates may advantageously be printed circuits. In particular, these may be flexible circuits produced from polyimide films. These printed circuits may advantageously comprise components enabling the number of connections to the device for controlling and processing the signal to be reduced.

The subject of the invention is also a process for manufacturing an-acoustic probe comprising a matrix of M×N piezoelectric elements distributed on the surface of an acoustic attenuation layer, the said elements being connected to an electronic device (control circuit) via an interconnection system, characterized in that the production of the interconnection system comprises the following steps:

- producing M dielectric substrates on each of which are produced N conducting tracks and a window in which the conducting tracks are locally left bare;
- stacking the M dielectric substrates, leading to the formation of a cavity corresponding to the stack of the M windows;
- filling the preformed cavity with an electrically insulating, acoustically absorbent material;
- cutting the stack of the M dielectric substrates in a plane Pc lying within the cavity filled with insulating, acoustically absorbent material.

The conducting tracks may be produced by depositing a metal layer, followed by an etching step enabling the said tracks to be defined.

Finally, the subject of the invention is a process for manufacturing an acoustic probe, characterized in that it comprises:

- depositing a conducting layer on the surface of the part 1 of the interconnection system;
- bonding a layer of piezoelectric material;
- cutting the conducting and piezoelectric layers in N-1 direction $D_y$;
- bonding a quarter-wave plate onto the entire surface of the piezoelectric layer cut into N elements;

cutting the three thicknesses, of conducting layer, piezoelectric layer and quarter-wave plate, in M-1 directions $D_x$.

BRIEF DESCRIPTION OF THE DRAWINGS

The invention will be more clearly understood and other advantages will appear on reading the following description, given by way of non-limiting example, and by means of the appended figures among which.

DISCUSSION OF THE PREFERRED EMBODIMENTS

In general, the acoustic probe according to the invention comprises a transducer consisting of a matrix (a linear or preferably two-dimensional matrix) of piezoelectric sensors, the said transducer being mounted on a matrix of facing interconnection contacts. This interconnection matrix consists of the ends of metal tracks emerging from one of the faces of an interconnection system described hereinbelow and called a "backing". The opposite ends of the metal tracks are connected to an electronic control and analysis device.

Figure 1:
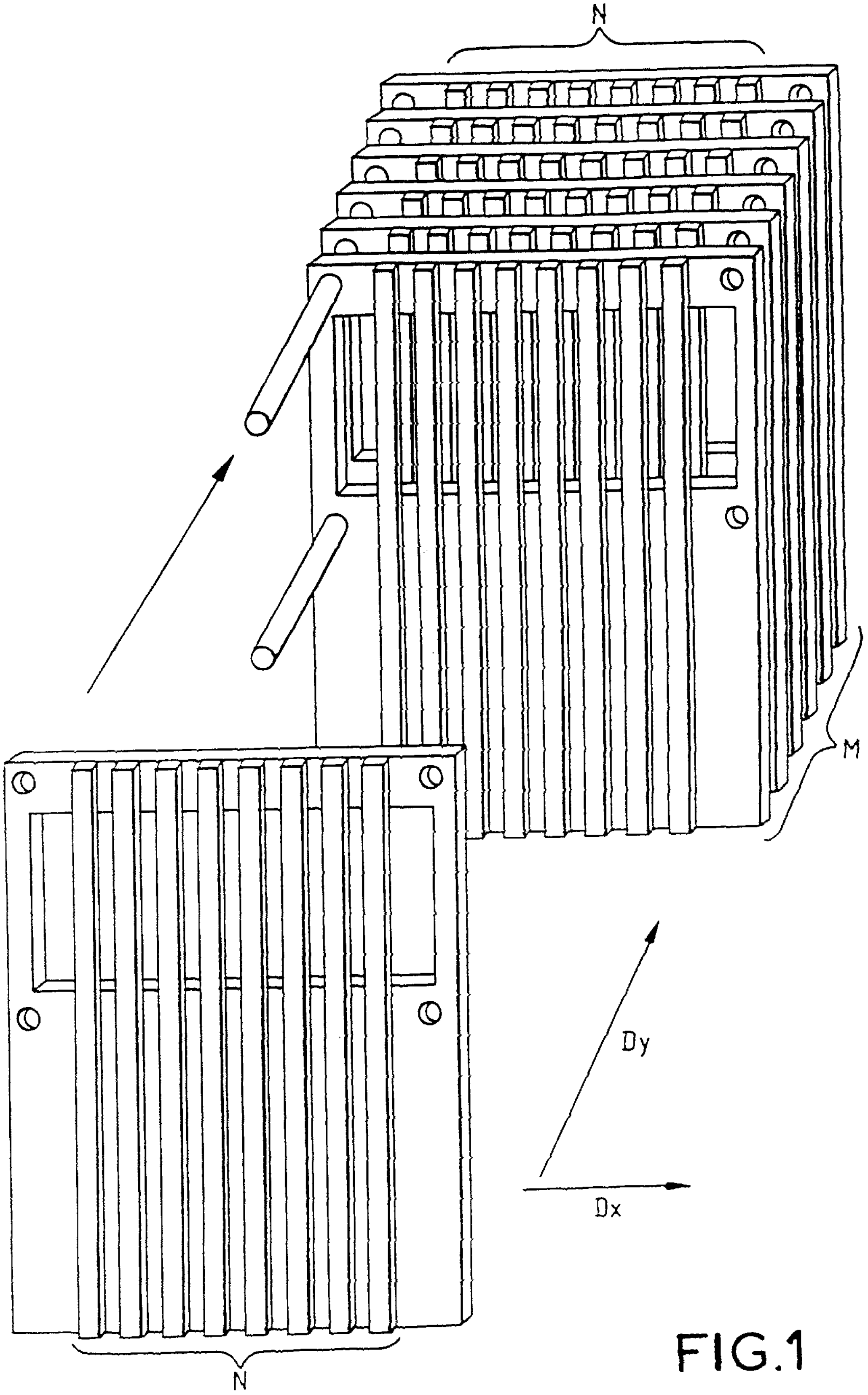
FIG. 1 illustrates one step in the process for manufacturing an acoustic probe, according to the invention.

In the case of a matrix of M×N piezoelectric elements, the interconnection system may be produced in the following manner:

According to one variant of the invention, M dielectric substrates are used, on which N conducting tracks have been produced along one axis $D_x$. Each substrate includes a window in which the conducting tracks are locally left bare. The set of M substrates is aligned and stacked in a direction $D_y$, as illustrated in FIG. 1. A stack of M dielectric substrates is thus obtained, the said stack having a cavity which includes M×N conducting tracks.

Figure 2:
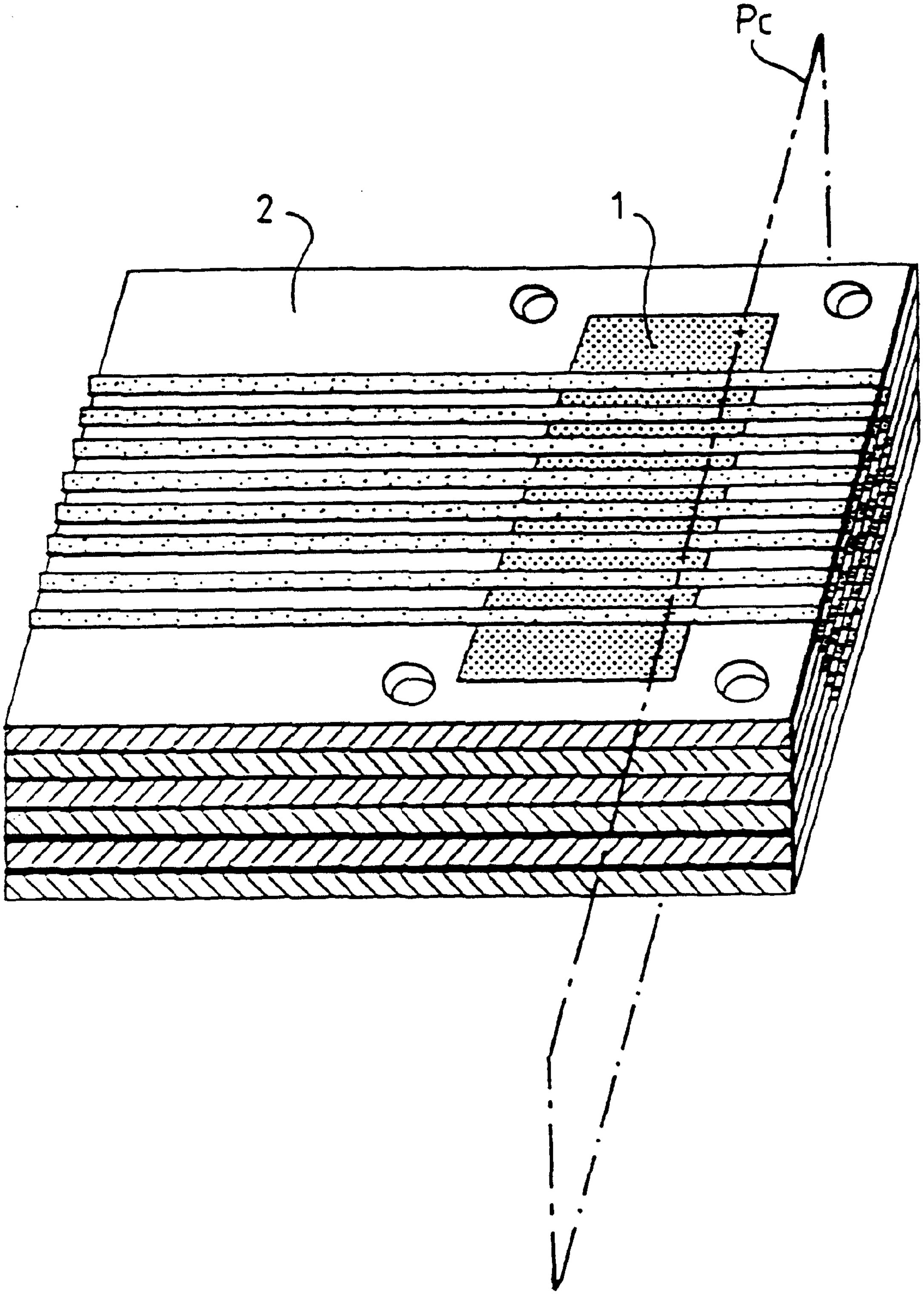
FIG. 2 illustrates the step in which the stack produced and illustrated in FIG. 1 is cut in a plane $P_c$ so as to define sections of conducting tracks which can be connected to the piezoelectric transducers.

This cavity is filled with an electrically insulating curable resin having the desired acoustic attenuation properties. After the resin has cured, the stack is cut in a plane Pc perpendicular to the axis of the tracks, within the preformed cavity as illustrated in FIG. 2, so as to produce a surface consisting of M×N sections of tracks perpendicularly flush with the resin.

In order to make the connections between these M×N sections of tracks and the piezoelectric elements, the following procedure may advantageously be carried out:

The entire surface consisting of the M×N sections of tracks is metallized. On this surface is applied a layer of piezoelectric material, which may be of the PZT type, and optionally an acoustic matching layer of the quarter-wave plate type. All these layers and the metallization are then cut, for example by sawing, so as to define the matrix of mutually independent transducer blocks $T_{ij}$. The cutting may be stopped at the surface of the resin and control of this etching operation does not need to be extremely precise, making this process particularly beneficial. This type of process makes it possible, from a narrow section of conducting track, to align and define a conducting interconnection surface just as wide as the base of a piezoelectric transducer.

The interconnection system thus produced comprises two joined parts, one being based on an acoustically absorbent material (part 1), the other being based on a dielectric (part 2), both parts comprising the conducting tracks.

Figure 3:
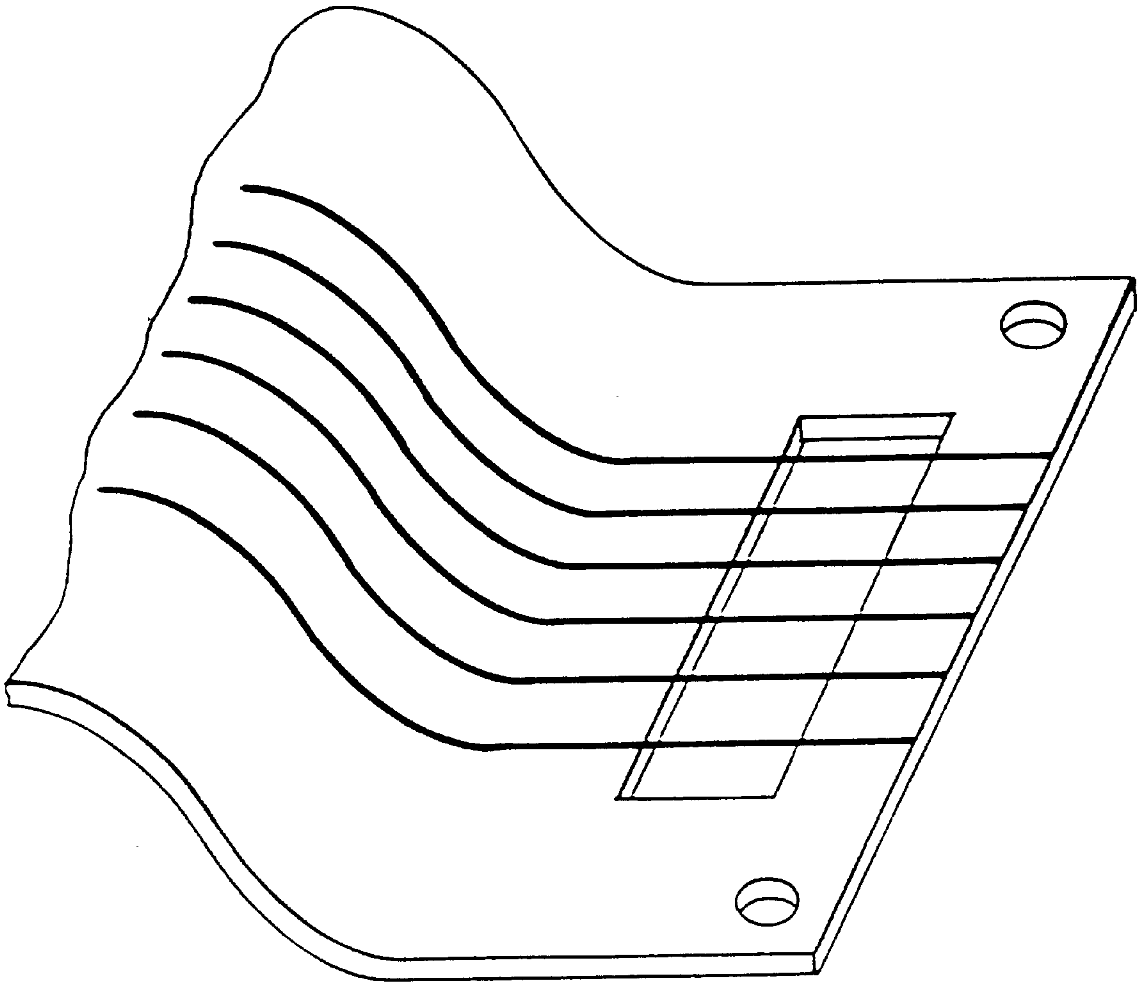
FIG. 3 illustrates an example of a flexible printed circuit which can be used in an interconnection system for the acoustic probe according to the invention.
Figure 4:
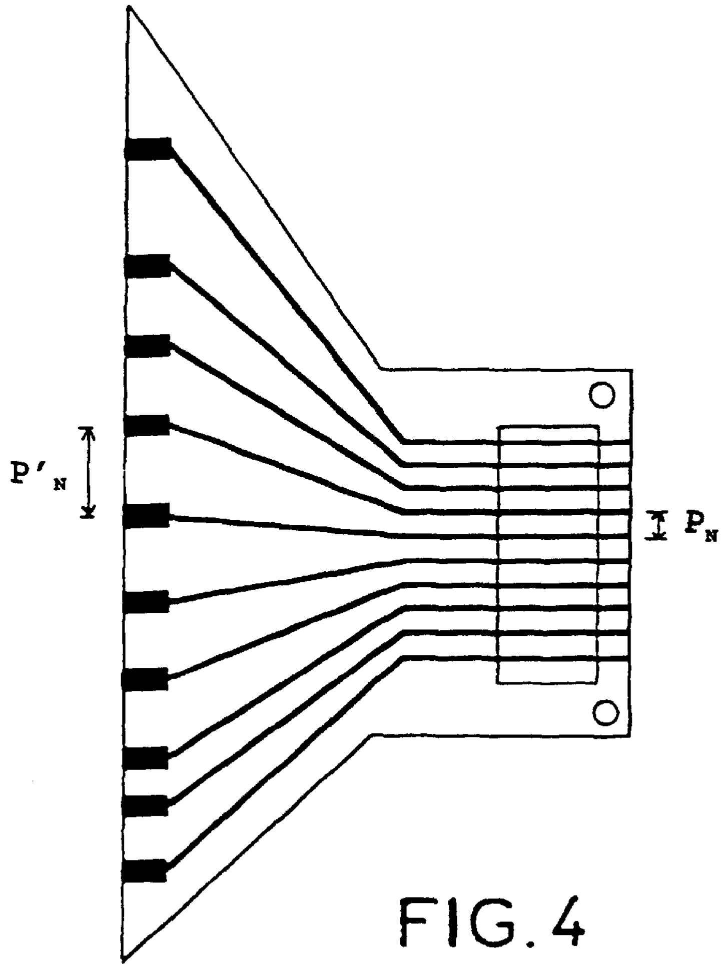
FIG. 4 illustrates a second example of a printed circuit which can be used in the interconnection system for the acoustic probe according to the invention.

The dielectric substrates may advantageously be flexible printed circuits comprising, at one of their end, conducting tracks; an example of this type of printed circuit and illustrated in FIG. 3. With this type of substrate, on going from the end bearing the metal sections intended to be connected to the transducers, the spacing $P'_N$ of the tracks and the spacing $P'_M$ of the stack of substrates may advantageously increase on going away from the said end. By "fanning out" the geometries in this way, the interconnection with the electronic device for controlling and processing the signal and all these components is facilitated. The spacing $P'_N$ of the tracks of the printed circuits may easily be controlled using the conventional techniques of photolithography and etching. The widening-out of the stacking spacing $P'_M$ is well-controlled directly, virtue of the use of flexible circuits.

The configuration proposed here for the "backing" makes it possible simultaneously to shift the matrix connection system a certain distance (by virtue of the acoustically absorbent material) and to fan out the geometry so as to allow the mounting of the cables (the soldering of coaxial cables, with one cable per element).

Figure 6:
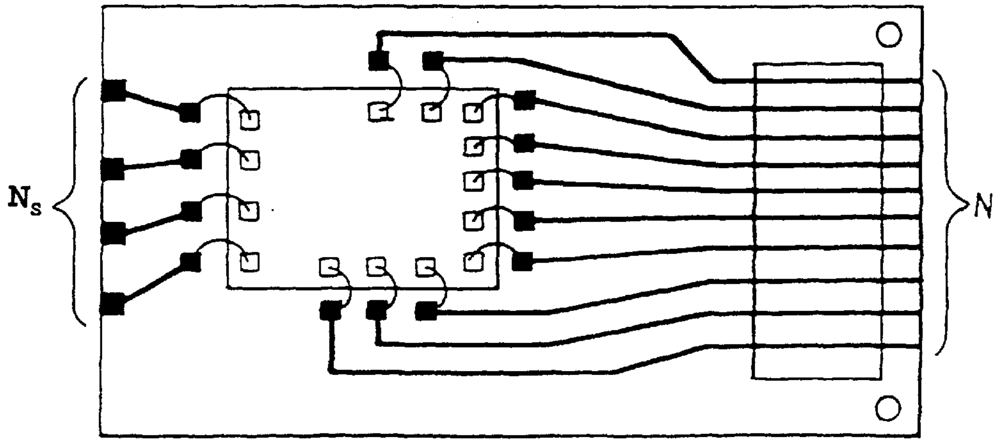
FIG. 6 illustrates a dielectric substrate which incorporates a chip and can be used in the part 2 of the interconnection system.
Figure 5:
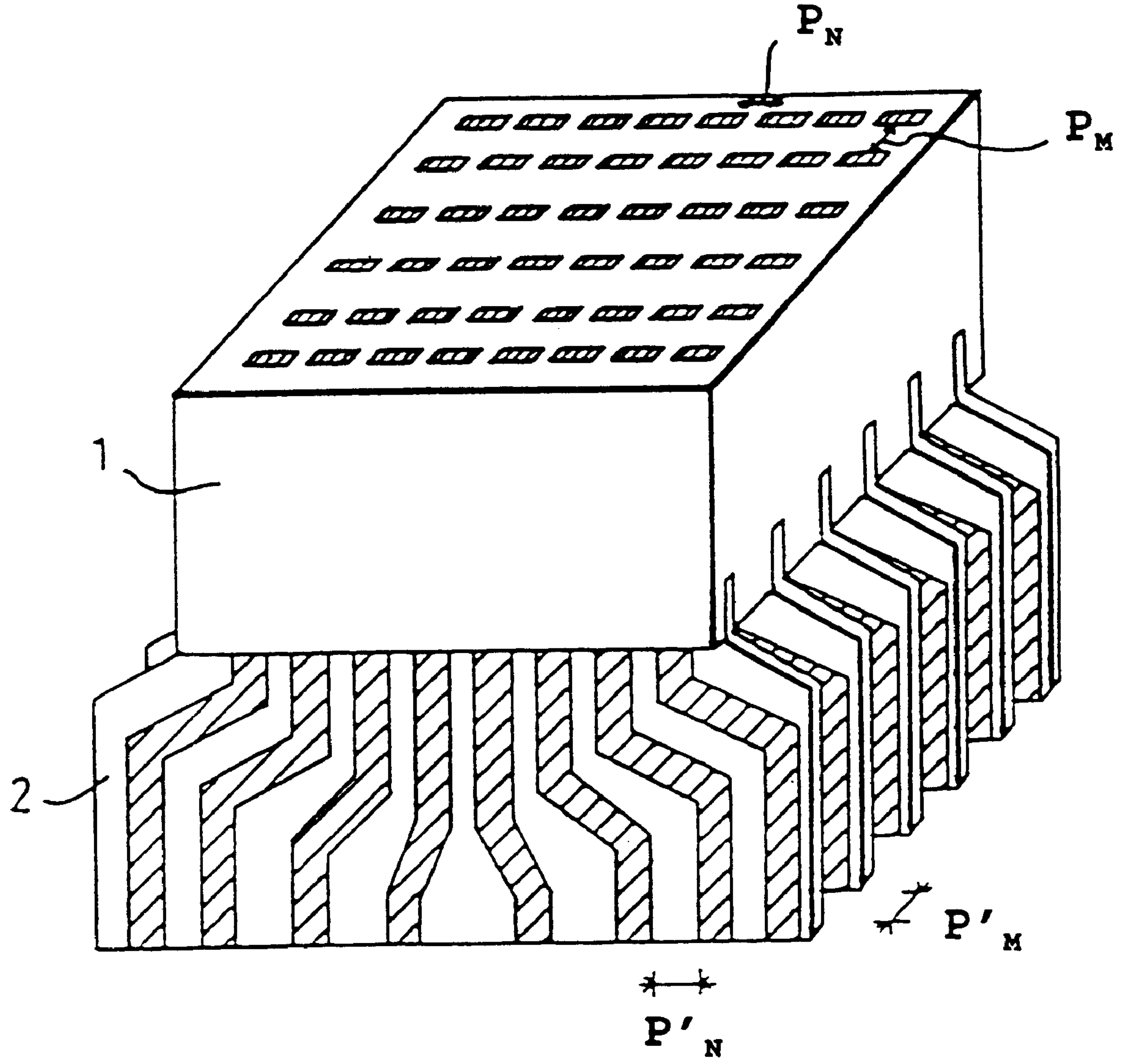
FIG. 5 illustrates an example of an interconnection system used in a probe according to the invention, comprising printed circuits such as those illustrated in FIG. 4.

Moreover, the printed circuits used in the invention may advantageously be of the type illustrated in FIG. 6. This is a printed circuit on which N input metal tracks are connected to a chip, having a greater number of inputs than the number of outputs directed towards the device for controlling and processing the signal.

This is because components may be mounted directly on the printed circuit, for example by wire bonding, TAB (Tape Automated Bonding) or by a flip-chip microball process, these being perfectly well-controlled and reliable technologies. In this case, the number of contacts at the other end of the "backing" may be greatly reduced.

There now follows a description of an example of one embodiment of an acoustic probe according to the invention which consists of a matrix of 64×64 piezoelectric transducer elements:

- to produce the interconnection system, polyimide films approximately 100 $\mu$m in thickness are used;
- one face of the said polyimide films is metallized by depositing copper, the thickness of the metallization being about 35 $\mu$m;
- 64 conducting tracks 50 $\mu$m in width at a spacing $P_N$ of about 200 $\mu$m are etched;
- a window is produced on each polyimide dielectric substrate, as well as positioning holes on the periphery of the said substrate, by laser cutting ($CO_2$ laser type);
- the set of 64 polyimide films is stacked, optionally inserting layers of adhesive and shims;

the cavity resulting from the stack of the set of windows is filled with an epoxy-type resin filled with tungsten balls;

the stack of the dielectric substrates is cut in the plane $P_C$.

A conducting layer is deposited, for example by vacuum metallization, on the interconnection system thus produced, to which layer is affixed a plate of piezoelectric material, of the PZT type, by adhesive bonding.

Cutting is carried out in the direction $D_y$ of the transducer matrix comprising 64 elements separated by a spacing $P_N$=200-μm in the direction $D_x$.

The acoustic matching plates are adhesively bonded in the same way. The lower face of the first plate is metallized, thereby bringing the earths to the edges of the matrix.

Finally, cutting (from the quarter-wave plate/ceramic layer assembly) is carried out in the direction $D_x$ of the 64 rows of elements with the 200 μm spacing $P_M$ in the direction $D_y$.

Figure 7:
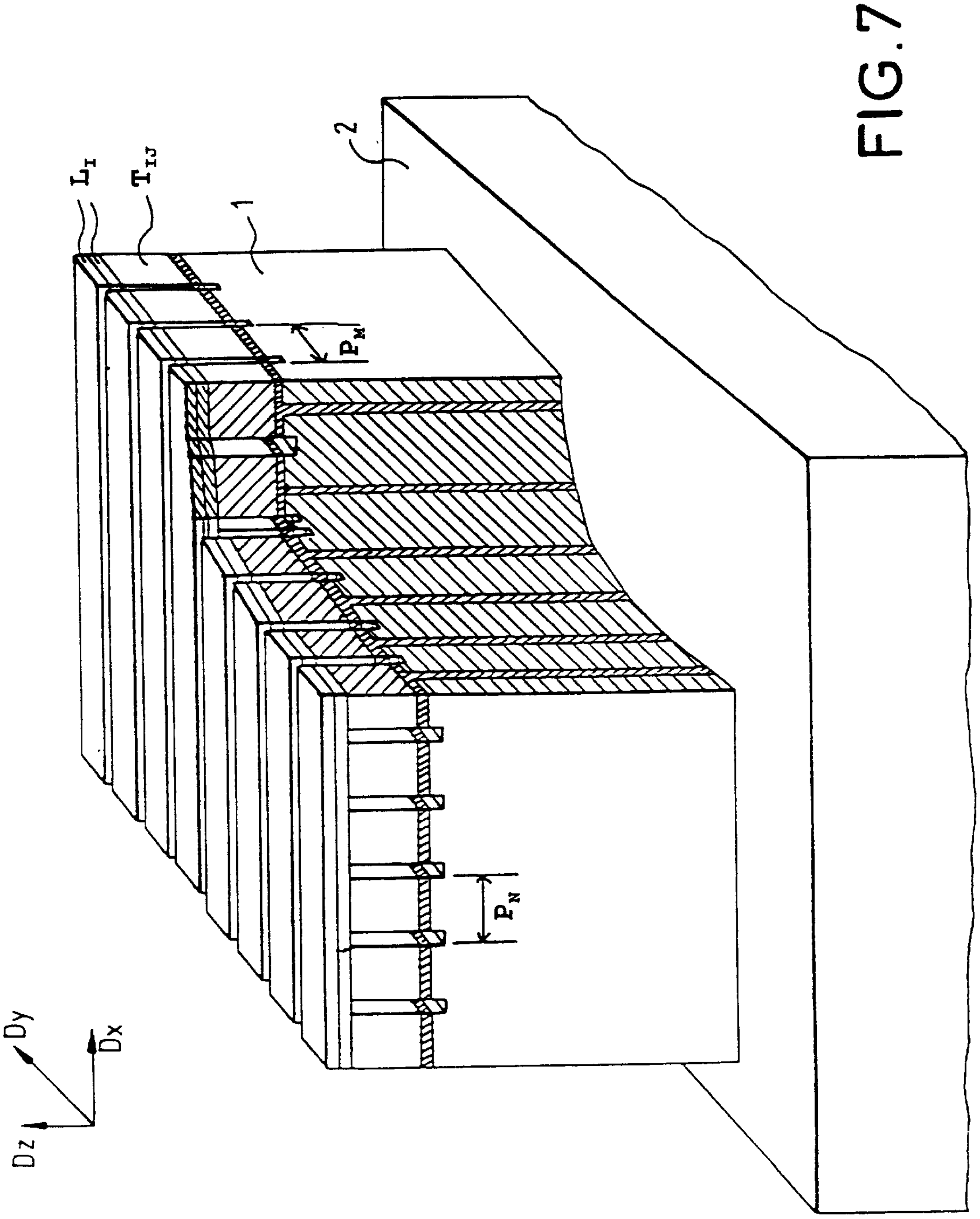
FIG. 7 illustrates the set of $T_{ij}$ piezoelectric transducers covered with $L_i$ quarter-wave plates and connected to the part 1 of the interconnection system.

FIG. 7 illustrates these various process steps leading to the formation of M×N piezoelectric elements $T_{ij}$ covered with $L_i$ quarter-wave plates. In this figure, only the part 1 of the interconnection system is shown, this being the part which supports the various transducers.

We claim:

1. Process for manufacturing an acoustic probe comprising a matrix of M×N piezoelectric elements distributed on the surface of an acoustic attenuation layer, the said elements being connected to an electronic device for controlling and processing the signal via an interconnection system, characterized in that the production of the interconnection system comprises the following steps:

producing M dielectric substrates on each of which are produced N conducting tracks and a window in which the conducting tracks are locally left bare;

stacking the M dielectric substrates, leading to the formation of a cavity corresponding to the stack of the M windows;

filling the preformed cavity with an electrically insulating, acoustically absorbent material;

cutting the stack of the M dielectric substrates in a plane lying within the cavity filled with insulating, acoustically absorbent material.

2. Process for producing an acoustic probe according to claim 1, characterized in that the M dielectric substrates are printed circuits.

3. Process for producing an acoustic probe according to claim 1, characterized in that it comprises:

depositing a conducting layer on the surface of part of the interconnection system;

bonding a layer of piezoelectric material;

cutting the conducting and piezoelectric layers by N-1 cuts in a first direction;

bonding a quarter-wave plate onto the entire surface of the piezoelectric layer cut into N elements;

cutting the three thicknesses, of conducting layer, piezoelectric layer and quarter-wave plate, by M-1 cuts in a second direction perpendicular to said first direction.

* * * * *